(12) United States Patent
Niimi et al.

(10) Patent No.: US 10,439,041 B2
(45) Date of Patent: *Oct. 8, 2019

(54) FRINGE CAPACITANCE REDUCTION FOR REPLACEMENT GATE CMOS

(71) Applicant: Texas Instruments Incorporated, Dallas, TX (US)

(72) Inventors: Hiroaki Niimi, Cohoes, NY (US); Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/686,449

(22) Filed: Aug. 25, 2017

(65) Prior Publication Data

US 2017/0358659 A1   Dec. 14, 2017

Related U.S. Application Data

(63) Continuation of application No. 15/093,881, filed on Apr. 8, 2016, now Pat. No. 9,780,192, which is a
(Continued)

(51) Int. Cl.
*H01L 29/66* (2006.01)
*H01L 29/51* (2006.01)
(Continued)

(52) U.S. Cl.
CPC .. *H01L 29/66545* (2013.01); *H01L 21/02164* (2013.01); *H01L 21/02178* (2013.01); *H01L 21/02181* (2013.01); *H01L 21/02186* (2013.01); *H01L 21/02189* (2013.01); *H01L 21/28123* (2013.01); *H01L 21/28167* (2013.01); *H01L 21/28194* (2013.01); *H01L 21/28238* (2013.01); *H01L 21/31053* (2013.01); *H01L 21/31055* (2013.01); *H01L 21/31111* (2013.01); *H01L 21/3212* (2013.01); *H01L 21/32133* (2013.01); *H01L 21/823456* (2013.01); *H01L 21/823468* (2013.01); *H01L 21/823842* (2013.01); *H01L 21/823857* (2013.01); *H01L 27/0922* (2013.01); *H01L 29/513* (2013.01); *H01L 29/517* (2013.01); *H01L 29/66553* (2013.01); *H01L 21/0228* (2013.01); *H01L 21/28079* (2013.01); *H01L 21/28088* (2013.01); *H01L 21/32* (2013.01); *H01L 29/42368* (2013.01);
(Continued)

(58) Field of Classification Search
CPC .............. H01L 29/66553; H01L 21/02186
See application file for complete search history.

(56) References Cited

U.S. PATENT DOCUMENTS

| | | | | |
|---|---|---|---|---|
| 5,880,502 | A * | 3/1999 | Lee ............. | H01L 21/82385 257/369 |
| 9,012,319 | B1 * | 4/2015 | Choi ............ | H01L 21/28158 438/591 |

(Continued)

*Primary Examiner* — Moazzam Hossain
*Assistant Examiner* — Farun Lu
(74) *Attorney, Agent, or Firm* — Jacqueline J. Garner; Charles A. Brill; Frank D. Cimino

(57) ABSTRACT

A replacement metal gate transistor structure and method with thin silicon nitride sidewalls and with little or no high-k dielectric on the vertical sidewalls of the replacement gate transistor trench.

16 Claims, 10 Drawing Sheets

Related U.S. Application Data continuation of application No. 14/578,722, filed on Dec. 22, 2014, now Pat. No. 9,337,297.

(60) Provisional application No. 61/922,446, filed on Dec. 31, 2013.

(51) Int. Cl.
  *H01L 21/3105* (2006.01)
  *H01L 21/3213* (2006.01)
  *H01L 21/311* (2006.01)
  *H01L 21/321* (2006.01)
  *H01L 21/02* (2006.01)
  *H01L 21/28* (2006.01)
  *H01L 21/8234* (2006.01)
  *H01L 21/8238* (2006.01)
  *H01L 27/092* (2006.01)
  *H01L 29/49* (2006.01)
  *H01L 29/423* (2006.01)
  *H01L 29/78* (2006.01)
  *H01L 21/32* (2006.01)

(52) U.S. Cl.
  CPC ........ *H01L 29/495* (2013.01); *H01L 29/4966* (2013.01); *H01L 29/7833* (2013.01)

(56) References Cited

U.S. PATENT DOCUMENTS

| | | | |
|---|---|---|---|
| 9,337,297 B2* | 5/2016 | Niimi | H01L 29/517 |
| 2009/0189201 A1* | 7/2009 | Chang | H01L 29/66545 |
| | | | 257/288 |
| 2012/0139062 A1* | 6/2012 | Yuan | H01L 21/76897 |
| | | | 257/411 |
| 2012/0276702 A1* | 11/2012 | Yang | H01L 27/11582 |
| | | | 438/270 |

* cited by examiner

FRINGE CAPACITANCE REDUCTION FOR REPLACEMENT GATE CMOS

CROSS-REFERENCE TO RELATED APPLICATIONS

This application is a continuation of U.S. Nonprovisional patent application Ser. No. 15/093,881, filed Apr. 8, 2016, which is a continuation of Ser. No. 14/578,722, filed Dec. 22, 2014 (now U.S. Pat. No. 9,337,297), which claims the benefit of U.S. provisional application Ser. No. 61/922,446, filed Dec. 31, 2013, the contents of all of which are herein incorporated by reference in its entirety.

FIELD OF INVENTION

This invention relates to the field of integrated circuits. More particularly, this invention relates to replacement gate transistors in integrated circuits.

BACKGROUND

As the geometries for integrated circuits have scaled to smaller and smaller dimensions, it has become necessary to replace polysilicon transistor gates with metal gates to enable scaling to continue to smaller dimensions. When voltage is applied to a polysilicon gate the polysilicon grains next to the gate dielectric become depleted of carriers increasing the electrical thickness of the gate dielectric and exacerbating short channel effects. Metal gates do not deplete when voltage is applied to the metal gate.

Because the work function of most p-channel metal-oxide-semiconductor (PMOS) metal gate material changes when the metal gate is subjected to high temperatures such as is required to activate dopants, replacement gate processes have been developed to circumvent the work function problem. In a replacement gate process, transistors are first built in the usual manner using polysilicon gates and silicon dioxide gate dielectric. The polysilion gates and gate dielectric are then removed and replaced with high-k gate dielectric and metal gates. Typically after removal of the polysilicon replacement gate, high-k dielectric is deposited followed by metal gate deposition. The high-k dielectric typically deposits conformally on the sidewalls and bottom of the trench formed by removal of the polysilicon replacement gate. Metal gate material is then deposited to fill the trench.

Because of the high dielectric constant of the high-k dielectric on the sidewalls of the trench, fringe capacitance is increased which degrades transistor performance.

In addition, gate geometries have been scaled to such small dimensions (i.e., less than 30 nm) that when the trench width is reduced by the high-k dielectric deposition, it is difficult to completely fill the trench without forming voids.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A replacement metal gate transistor structure and method for forming with thin silicon nitride sidewalls and with little or no high-k dielectric on the vertical sidewalls of the replacement gate transistor trench.

DETAILED DESCRIPTION OF EXAMPLE EMBODIMENTS

The present invention is described with reference to the attached FIGURES. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
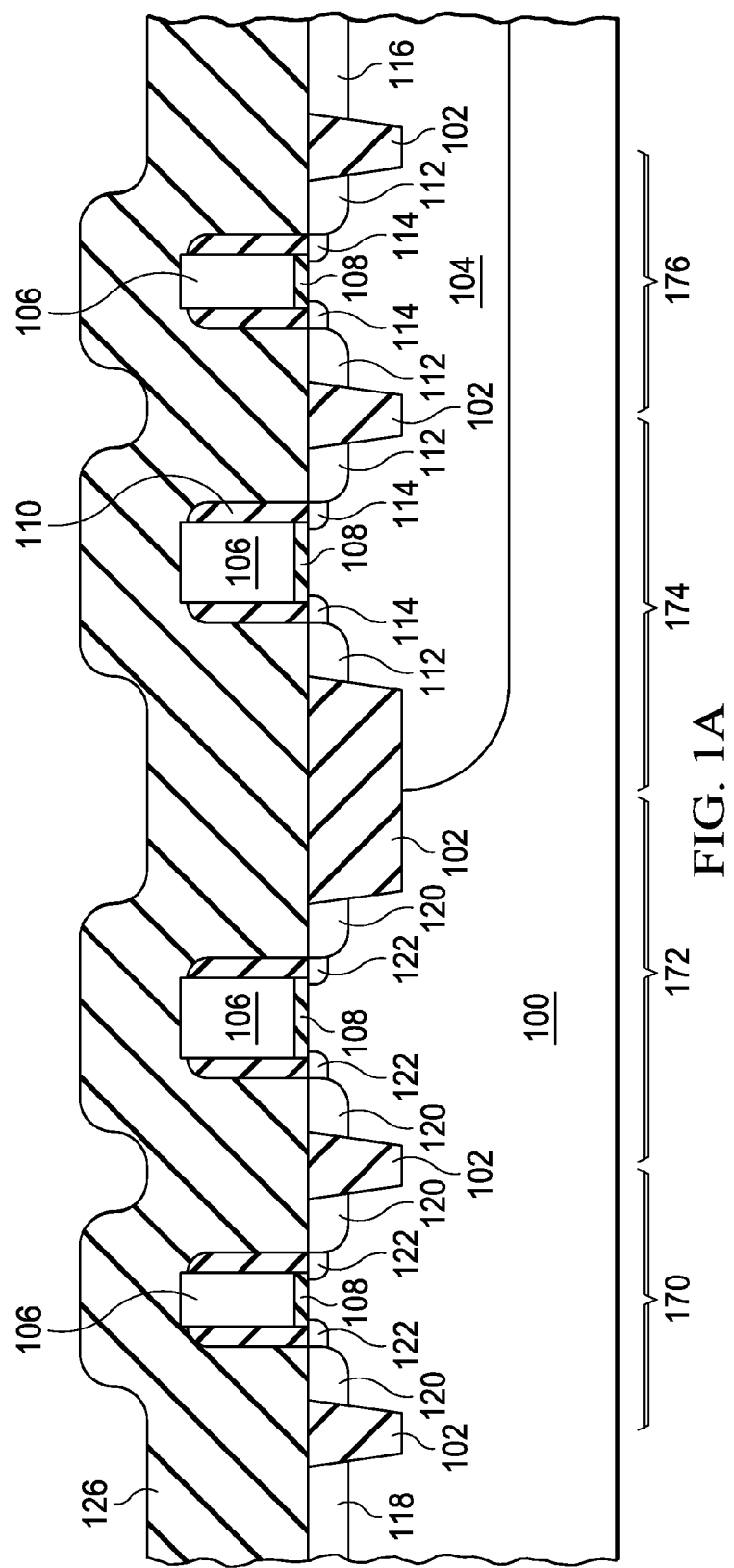
FIGS. 1A-1K are illustrations of steps in the fabrication of integrated circuits formed according to principles of the invention.
Figure 1B:
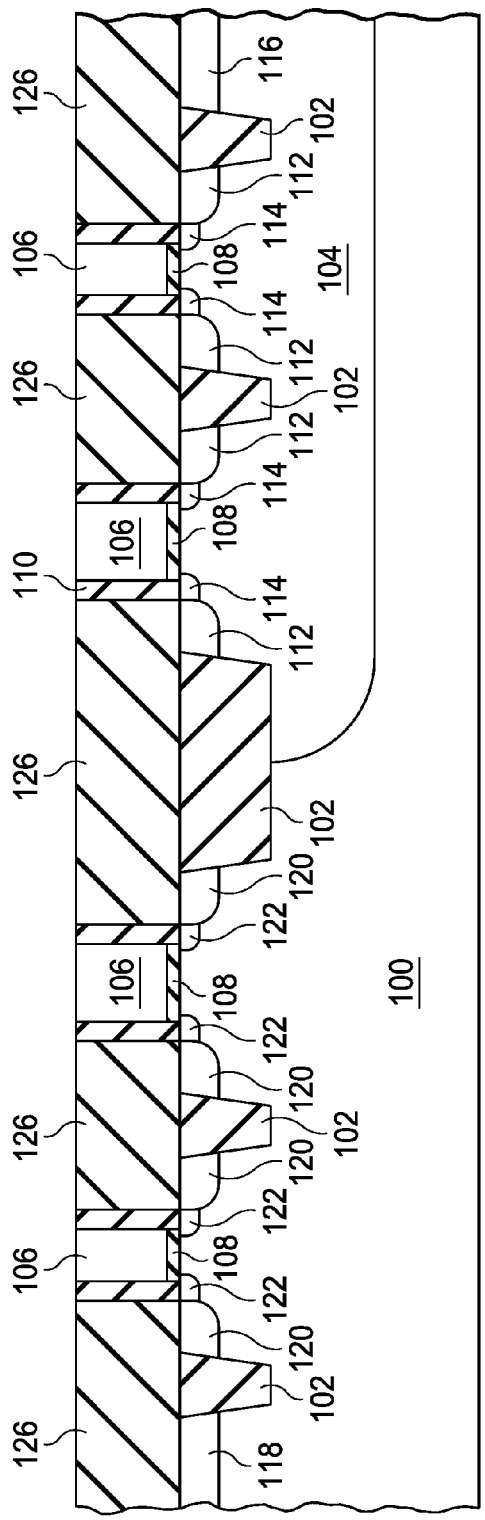
Figure 1C:
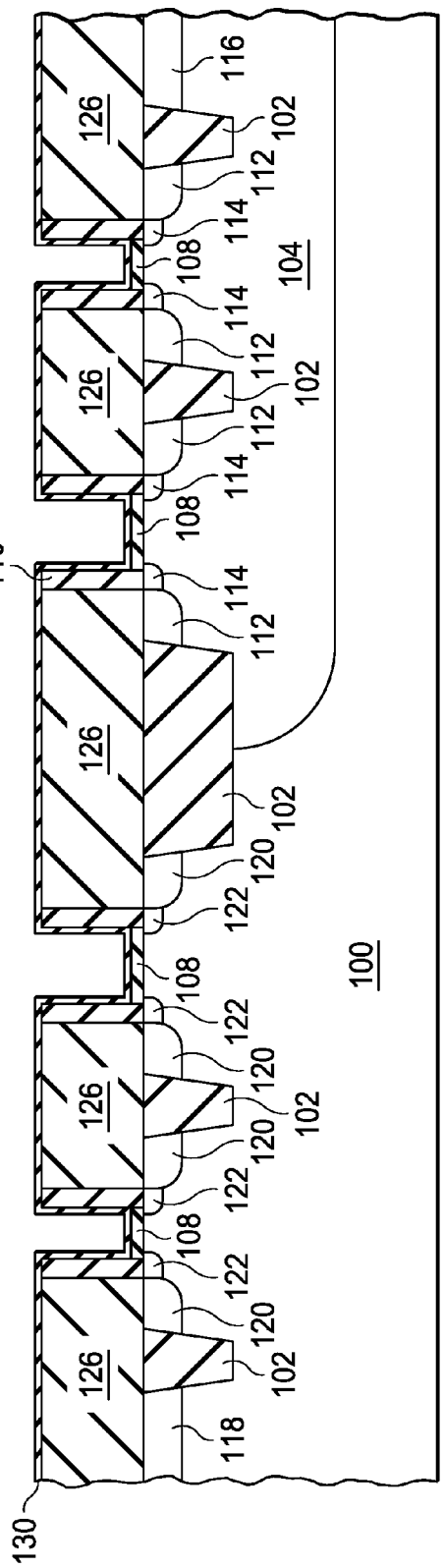
Figure 1D:
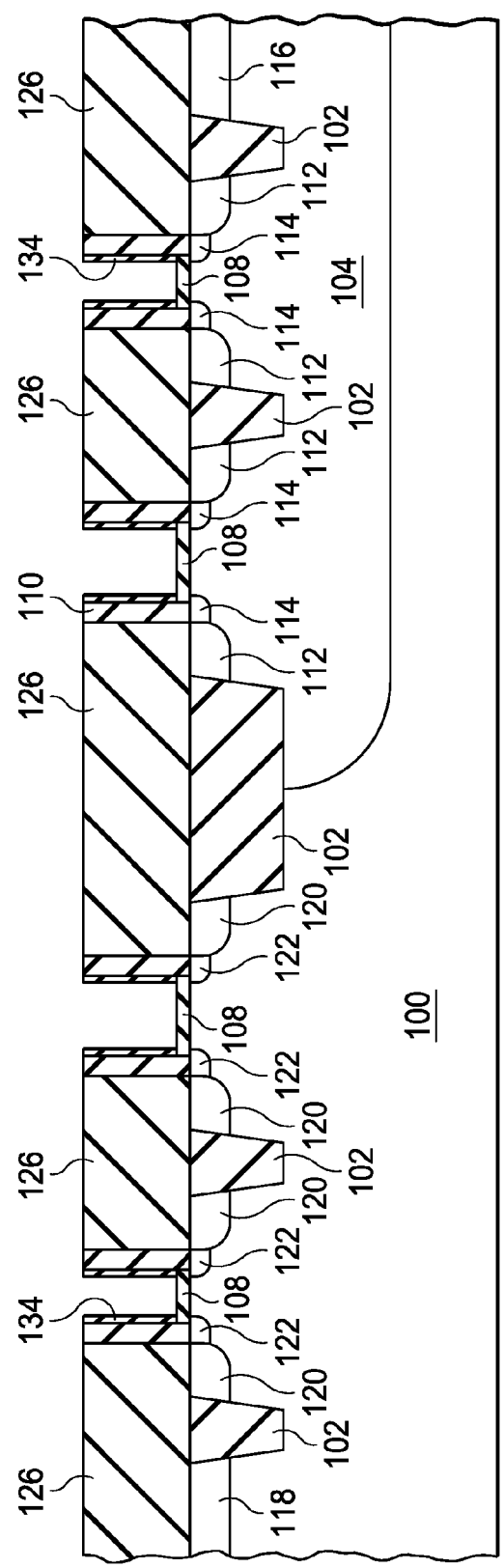
Figure 1E:
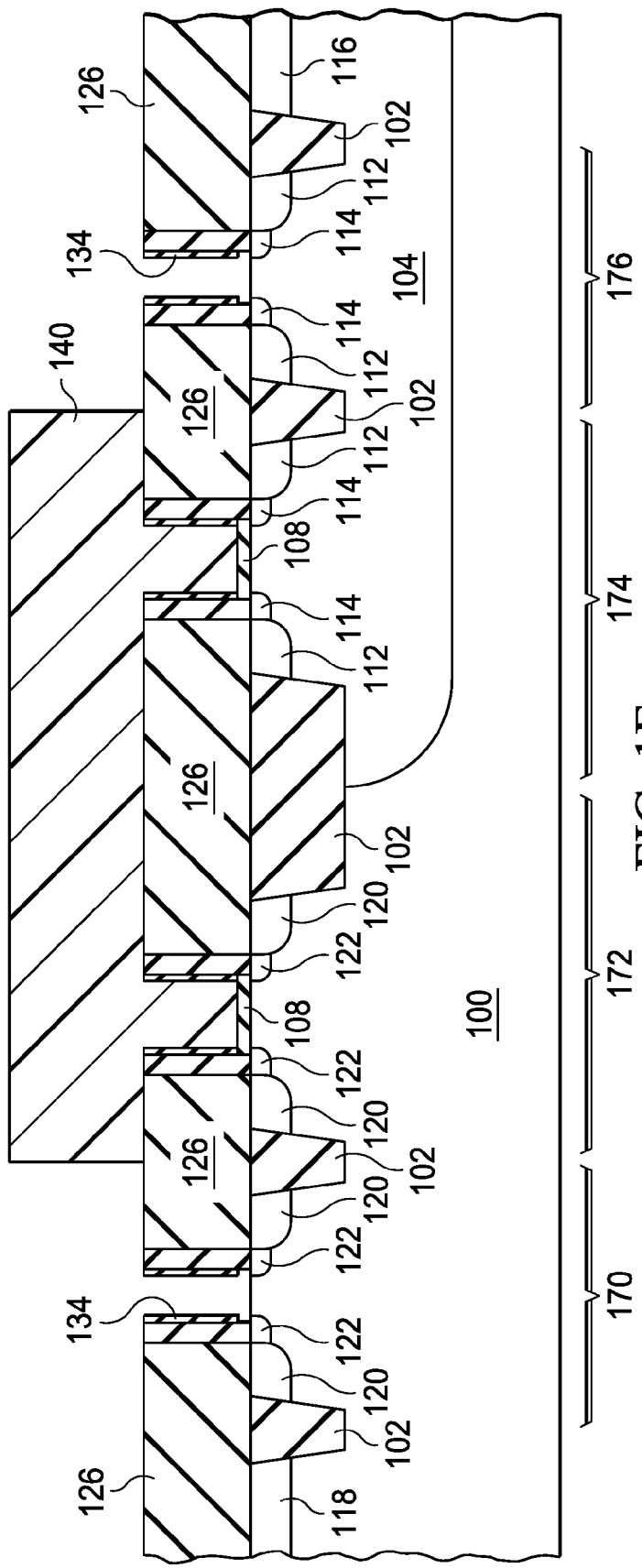
Figure 1F:
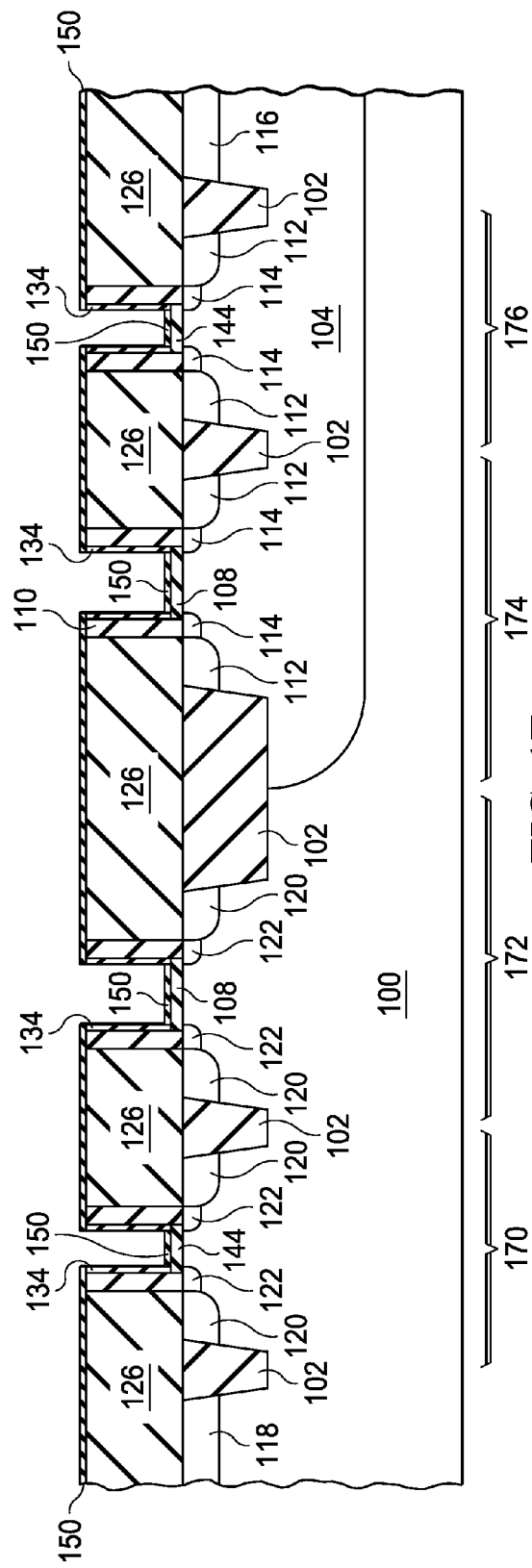
Figure 1G:
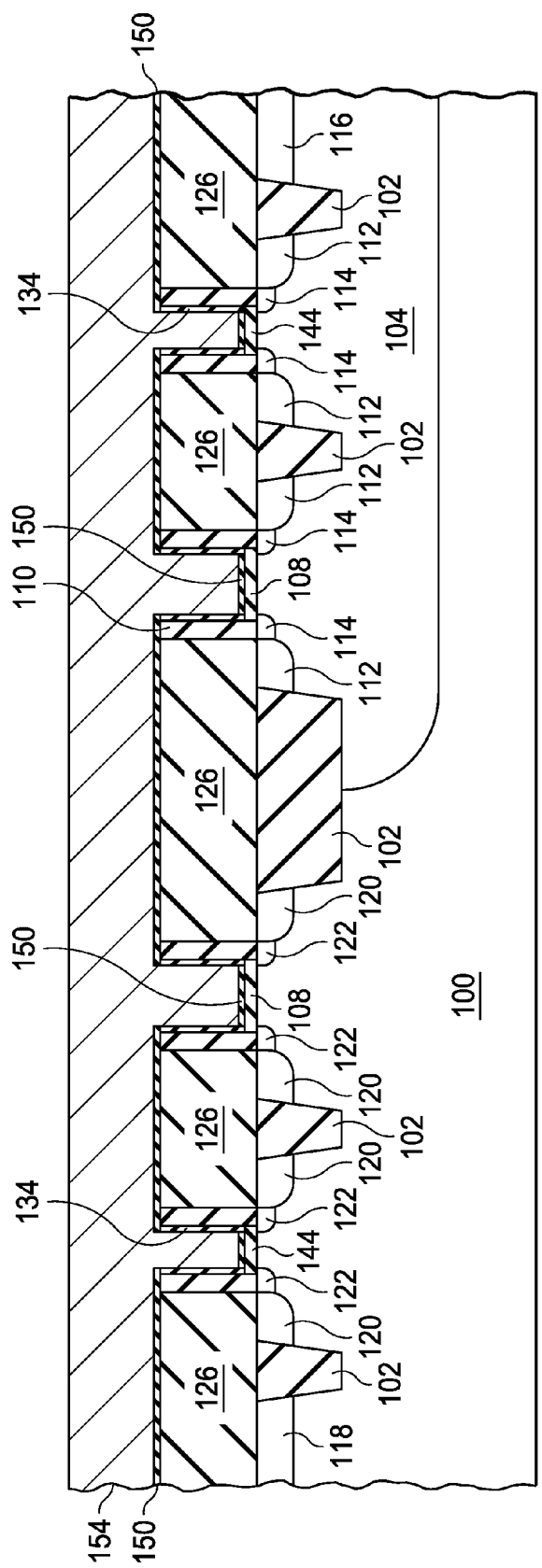
Figure 1H:
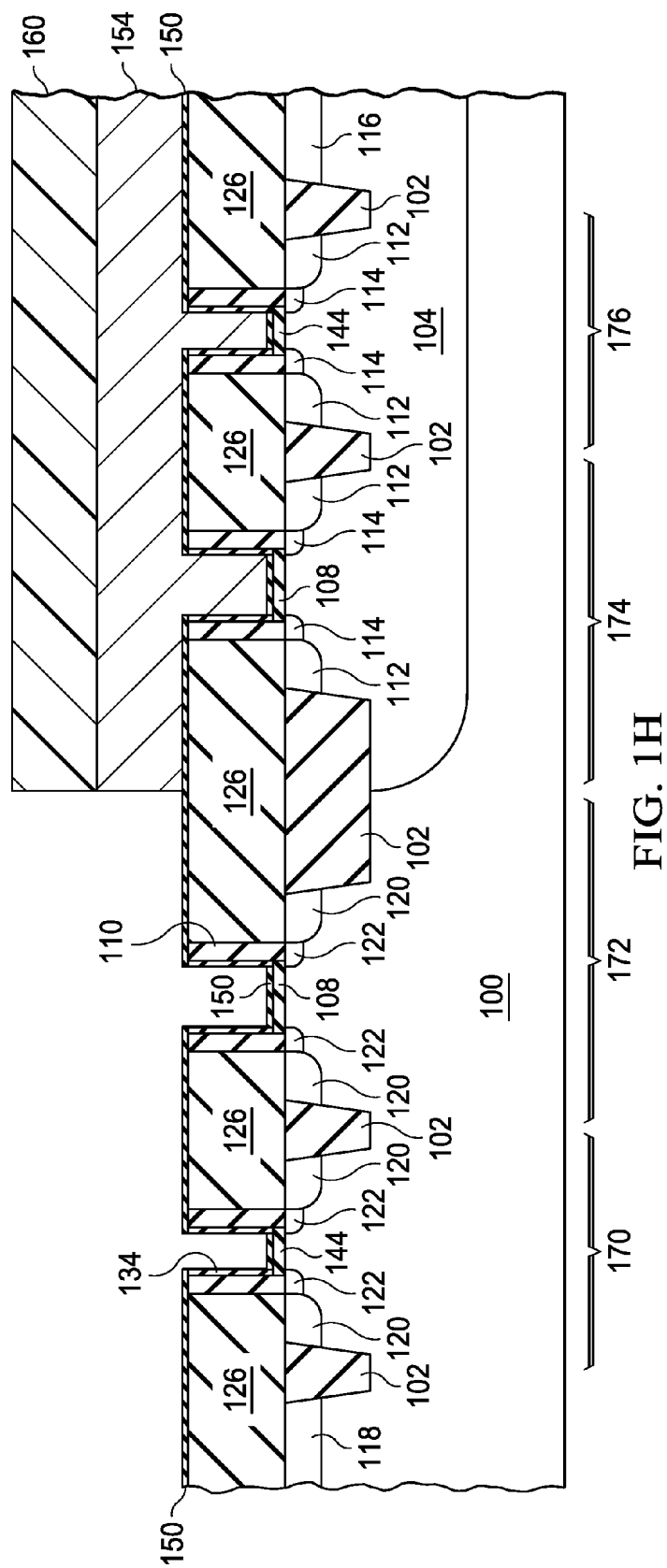
Figure 1I:
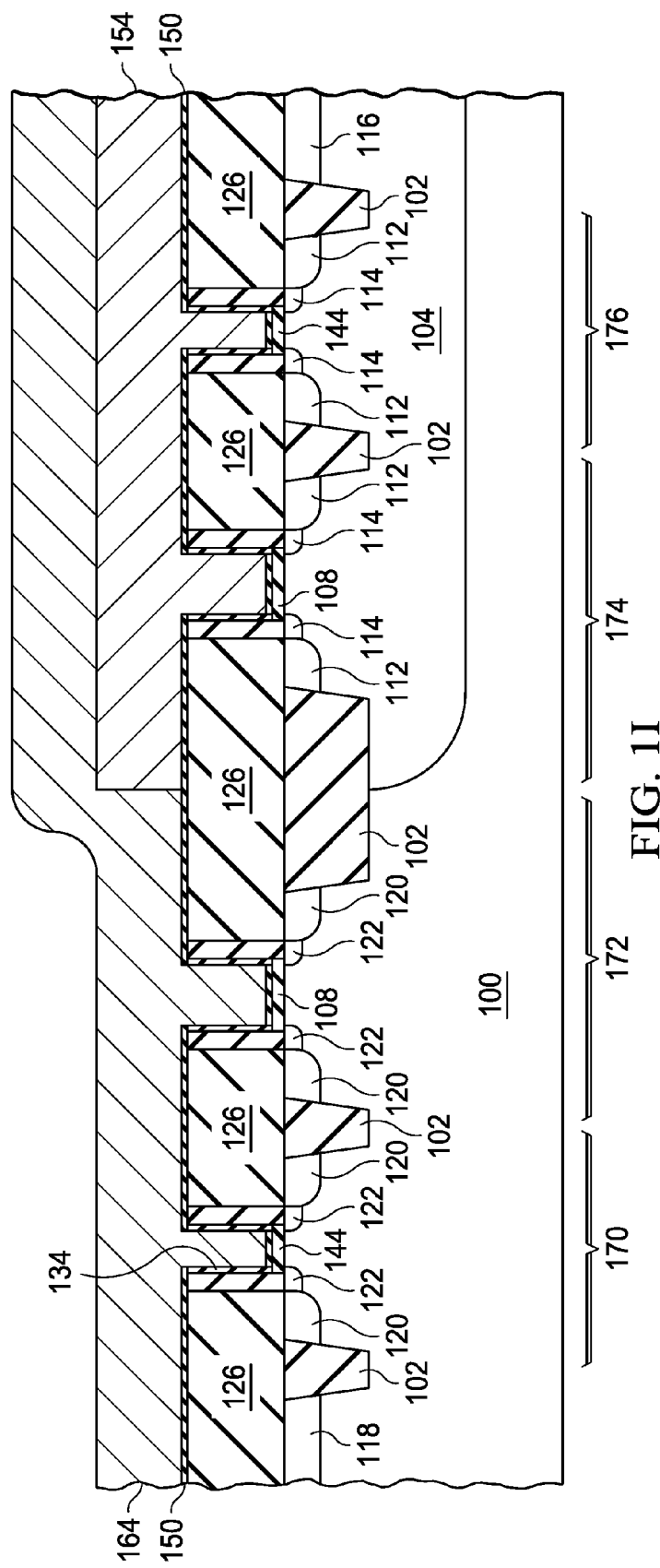
Figure 1J:
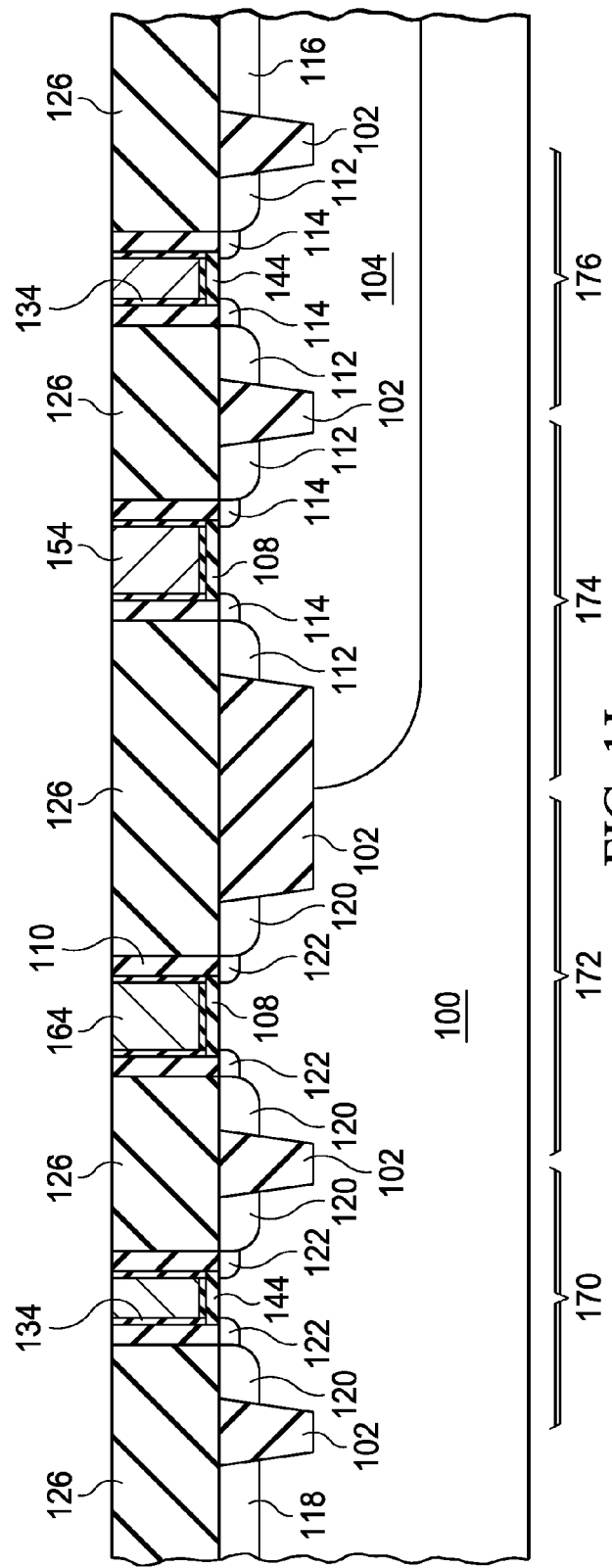

An integrated circuit formed using embodiments of the invention which reduces deposition of high-k dielectric on the sidewalls of the replacement gate transistor trench is shown in FIG. 1J. Thin sidewalls 134 of silicon nitride are formed on the vertical sides of the replacement gate transistor trenches prior to high-k gate dielectric 150 deposition. The thin silicon nitride sidewalls 134 blocks high-k dielectric 150 nucleation and thereby significantly reduces the deposition of high-k gate dielectric 150 on the vertical sidewalls of the replacement gate transistor trenches. A reduced thickness of high-k gate dielectric 150 on the sidewalls reduces fringe capacitance thereby improving transistor performance. In addition the reduced high-k thickness on the trench sidewalls increases the width of the trench improving the ability of the metal gate material to completely fill the replacement gate transistor trench without forming voids.

An example process flow that builds n-channel metal-oxide-semiconductor (NMOS) and p-channel metal-oxide-semiconductor (PMOS), high voltage and low voltage replacement gate transistors using embodiments is illustrated in FIGS. 1A through 1K.

FIG. 1A is a cross section of a partially processed integrated circuit with NMOS low voltage 170 and NMOS high voltage 172 transistors and PMOS low voltage 176 and PMOS high voltage 174 transistors.

In this example embodiment, the NMOS transistors 170 and 172 are formed in p-type substrate 100 and PMOS transistors 174 and 176 are formed in an nwell 104. Shallow trench isolation 102 electrically isolates the transistors from each other. Polysilicon transistor gates 106 are formed on a gate dielectric 108 such as silicon dioxide or nitrided silicon dioxide. N-type source and drain extensions 122 are formed self aligned to the polysilicon gates on the NMOS transistors 170 and 172 and p-type source and drain extensions 114 are formed self aligned to the polysilicon gates on the PMOS transistors 174 and 176. N-type deep source and drain diffusions 120 are formed self-aligned to the sidewalls 110 on the NMOS transistors 170 and 172 and p-type deep source and drain diffusions 112 are formed self-aligned to the sidewalls 110 on the PMOS transistors 174 and 176. The sidewalls 110 may be silicon dioxide to reduce fringe capacitance. Replacement gate dielectric 126 covers the transistors on the integrated circuit so that the surface of the replacement gate dielectric 126 is at least the height of the polysilicon transistor gates.

Referring now to FIG. 1B, chemical mechanical polish (CMP) is used to planarize the dielectric 126 and to expose the tops of the polysilicon replacement gates 106.

As shown in FIG. 1C, the polysilicon replacement gates are removed and a thin layer 130 of silicon nitride is formed on the surface of the dielectric 126 and on the surfaces of the replacement gate transistor trenches. The silicon nitride may be formed using atomic layer deposition (ALD) techniques or may be formed using plasma nitridation to form a thin layer 130 of silicon nitride on silicon dioxide sidewalls 110. The silicon nitride layer may be about 0.05 to 0.3 nm thick.

As illustrated in FIG. 1D, an anisotropic plasma etch may be used to remove the thin silicon nitride layer 130 from the horizontal surfaces on the replacement gate dielectric 126 and the bottom of the replacement gate trenches and leaving silicon nitride sidewalls 134 and 136 on the vertical sides of the replacement gate transistor trenches.

In FIG. 1E a high voltage photo resist pattern 140 is formed on the integrated circuit to prevent the gate dielectric 108 from being removed from the high voltage transistor, 172 and 174 trenches. The gate oxide dielectric 108 is removed from the bottom of the low voltage transistor, 170 and 176 trenches.

Referring now to FIG. 1F, gate oxide dielectric 144 is formed in the low voltage transistor trenches 170 and 176, and high-k dielectric 150 is deposited. The gate oxide dielectric 144 may be grown using SC1 (NH$_4$OH+ H$_2$O$_2$) wet chemistry. In an example embodiment, approximately 0.6 nm SiO$_x$ 144 is chemically grown using SC1. The high-k dielectric 150 may be a high-k dielectric such as HfO$_x$, HfSiO$_x$, HfSiON, ZrO$_2$, HFZrO$_x$, AlO$_x$, and TiO$_x$ in the range of about 1 to 4 nm thick. In an example embodiment approximately 1.5 nm HfO$_x$ is deposited using atomic layer deposition (ALD). The thin silicon nitride sidewalls 134 and 136 on the vertical sidewalls of the replacement gate transistor trenches retards high-k dielectric nucleation 150 the thickness of the high-k dielectric 150 thickness on the sidewalls of the replacement gate transistor trench is less than half the thickness of the high-k dielectric on the bottom of the trench. In most instances little or no high-k dielectric 150 is deposited on the sidewalls. Since little or no high-k dielectric 150 is deposited on the sidewalls of the trenches, little of the width of the trenches is reduced by deposited high-k dielectric. This enables the metal gate material to be deposited without trapping voids. In addition, fringe capacitance is reduced since the silicon nitride sidewalls 134 and 136 are thinner than high-k dielectric and the dielectric constant of silicon nitride is much lower than the dielectric constant of high-k dielectrics.

As shown in FIG. 1G, PMOS metal gate material 154 is then deposited into the replacement gate trenches. The PMOS metal gate material 154 may contain for example, one or more metals from the group consisting of titanium nitride, tantalum nitride, aluminum, and platinum. The trenches are wider because the high-k dielectric is thinner on the vertical sidewalls making the trenches easier to fill without the formation of voids. In an example embodiment the PMOS metal gate material 154 is about 8 nm of titanium nitride.

In FIG. 1H PMOS metal gate photo resist pattern 160 is formed on the integrated circuit to prevent the PMOS metal gate material 154 from being removed over the PMOS transistors, 174 and 176. The PMOS metal gate material 154 is removed from the NMOS transistors, 170 and 172.

Referring now to FIG. 1I, a NMOS transistor metal gate material 164 is deposited into the NMOS transistor, 170 and 172, replacement gate trenches. The trenches are wider because the high-k dielectric is thinner on the vertical sidewalls making the trenches easier to fill without the formation of voids. The NMOS metal gate material 164 may contain for example, one or more metals from the group consisting of titanium, aluminum, titanium-aluminum alloy, and tungsten. In an example embodiment the NMOS metal gate material 164 is about 3 nm of titanium-aluminum alloy.

CMP is used to remove the NMOS metal gate material 164 overfill and the PMOS metal gate material 154 overfill from the surface of the replacement gate dielectric 126 as shown in FIG. 1J.

Figure 1K:
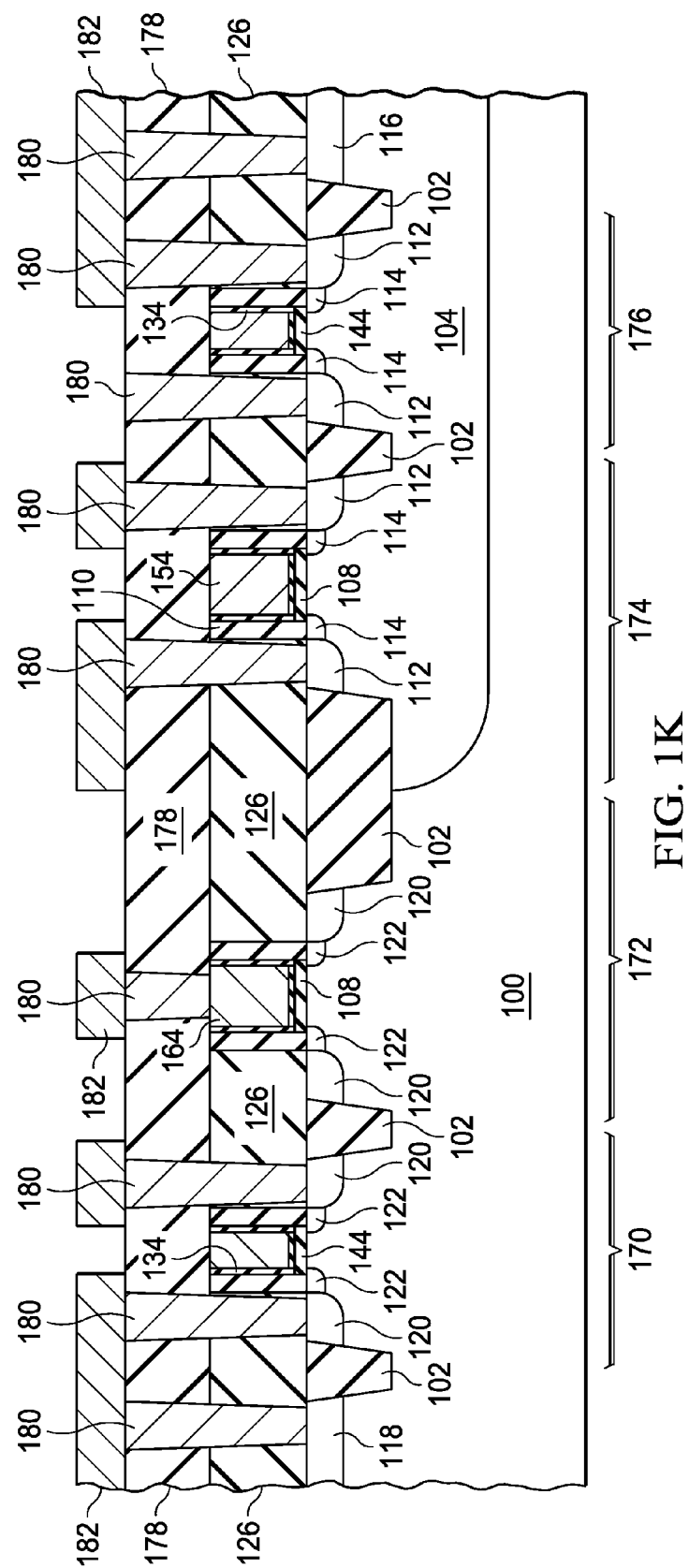

In FIG. 1K, a premetal dielectric layer (PMD) 178 may be deposited on the integrated circuit and contact plugs 180 formed through the PMD 178 and replacement gate dielectric 126 to affect electrical connection between the deep source and drain diffusions, 112 and 120, and the first layer of interconnect 182. Additional layers of dielectric and interconnect electrically connected by vias may be formed over the first layer of interconnect 182 to complete the integrated circuit.

Those skilled in the art to which this invention relates will appreciate that many other embodiments and variations are possible within the scope of the claimed invention.

What is claimed is:

1. An integrated circuit with a metal gate transistor comprising:
   a replacement gate transistor trench;
   silicon nitride sidewalls with a thickness of less than about 0.3 nm on vertical sidewalls of the replacement gate transistor trench;
   high-k gate dielectric, w herein a thickness of the high-k gate dielectric on the vertical sidewalls of the replacement gate transistor trench is less than half a thickness of the high-k gate dielectric over a bottom surface of the replacement gate transistor trench; and
   metal gate material covering the high-k gate dielectric and filling the replacement gate transistor trench.

2. The integrated circuit of claim 1, wherein the high-k gate dielectric is HfOx, HfSiOx, HfSiON, ZrO$_2$, HfZrOx, AlOx, or TiOx.

3. The integrated circuit of claim 1, wherein the metal gate transistor is an NMOS transistor, the high-k gate dielectric is HfOx, and the metal gate material is selected from the group titanium, aluminum, titanium-aluminum alloy, and tungsten.

4. The integrated circuit of claim 1, wherein the metal gate transistor is a PMOS transistor, the high-k gate dielectric is HfOx, and the metal gate material is selected from the group consisting of titanium nitride, tantalum nitride, aluminum, and platinum.

5. An integrated circuit comprising:
   a first gate trench of a first metal gate transistor;
   a silicon nitride layer with a first thickness on sidewalls of the first gate trench;
   a high-k gate dielectric, wherein a second thickness of the high-k gate dielectric on the sidewalls of the first gate trench that is less than half a third thickness of the high-k gate dielectric over a bottom surface of the first pate trench, wherein the first thickness is less than the third thickness; and
a first metal gate material covering the high-k gate dielectric and filling the first gate trench.

6. The integrated circuit of claim 5, wherein the high-k gate dielectric is HfOx, HfSiOx, HfSiON, ZrO$_2$, HfZrOx, AlOx, or TiOx.

7. The integrated circuit of claim 5, wherein the first metal gate transistor is an NMOS transistor, the high-k gate dielectric is HfOx, and the first metal gate material is selected from the group titanium, aluminum, titanium-aluminum alloy, and tungsten.

8. The integrated circuit of claim 5, wherein the first metal gate transistor is an PMOS transistor, the high-k gate dielectric is HfOx, and the first metal gate material is selected from the group consisting of titanium nitride, tantalum nitride, aluminum, and platinum.

9. The integrated circuit of claim 5, further comprising a second gate trench of a second transistor, wherein the second gate trench includes:
the silicon nitride layer;
the high-k gate dielectric; and
a second metal gate material covering the high-k gate dielectric in the second gate trench and filling the second gate trench.

10. The integrated circuit of claim 9, wherein:
the first metal gate transistor is an NMOS transistor, the high-k gate dielectric is HfOx, and the first metal gate material is selected from the group titanium, aluminum, titanium-aluminum alloy, and tungsten; and
the second metal gate transistor is a PMOS transistor and the second metal gate material is selected from the group consisting of titanium nitride, tantalum nitride, aluminum, and platinum.

11. The integrated circuit of claim 5, further comprising a gate oxide dielectric under the high-k gate dielectric in the first gate trench.

12. An integrated circuit comprising:
a first metal gate transistor comprising:
a first gate trench;
a silicon nitride layer with a first thickness on sidewalls of the first gate trench;
a high-k gate dielectric, wherein a second thickness of the high-k gate dielectric on the sidewalls of the first gate trench that is less than half a third thickness of the high-k gate dielectric over a bottom surface of the first gate trench, wherein the first thickness is less than the third thickness; and
a first metal gate material covering the high-k gate dielectric and filling the first gate trench;
a second metal gate transistor comprising:
a second gate trench wider than the first gate trench;
the silicon nitride layer on sidewalls of the second gate trench;
the high-k gate dielectric, wherein the second thickness of the high-k gate dielectric on the sidewalls of the second gate trench that is less than half the third thickness of the high-k gate dielectric over a bottom surface of the second gate trench; and
the first metal gate material covering the high-k gate dielectric and filling the second gate trench;
a third metal gate transistor comprising:
a third gate trench;
the silicon nitride layer on sidewalls of the third gate trench;
the high-k gate dielectric, wherein the second thickness of the high-k gate dielectric on the sidewalls of the third gate trench that is less than half the third thickness of the high-k gate dielectric over a bottom surface of the third gate trench; and
a second metal gate material covering the high-k gate dielectric in the third trench and filling the third gate trench; and
a fourth metal gate transistor comprising:
a fourth gate trench wider than the third gate trench;
the silicon nitride layer on sidewalls of the fourth gate trench;
the high-k gate dielectric, wherein the second thickness of the high-k gate dielectric on the sidewalls of the fourth gate trench that is less than half the third thickness of the high-k gate dielectric over a bottom surface of the fourth gate trench; and
the second metal gate material covering the high-k gate dielectric in the fourth gate trench and filling the fourth gate trench.

13. The integrated circuit of claim 12, wherein the high-k gate dielectric is HfOx, HfSiOx, HfSiON, ZrO$_2$, HfZrOx, AlOx, or TiOx.

14. The integrated circuit of claim 12, wherein the first metal gate transistor and the second metal gate transistors are NMOS transistors, the high-k gate dielectric is HfOx, and the first metal gate material is selected from the group titanium, aluminum, titanium-aluminum alloy, and tungsten.

15. The integrated circuit of claim 14, wherein the third metal gate transistor and fourth metal gate transistor are PMOS transistors and the second metal gate material is selected from the group consisting of titanium nitride, tantalum nitride, aluminum, and platinum.

16. The integrated circuit of claim 12, further comprising:
a first gate oxide dielectric under the high-k gate dielectric in the first gate trench and the third gate trench; and
a second gate oxide dielectric under the high-k gate dielectric in the second gate trench and the fourth gate trench.

* * * * *